United States Patent
Wu et al.

(10) Patent No.: US 9,755,594 B1
(45) Date of Patent: Sep. 5, 2017

(54) POWER AMPLIFYING CIRCUIT

(71) Applicant: Shenzhen South Silicon Valley Microelectronics Co., Limited, Hsinchu County (TW)

(72) Inventors: Pei-Si Wu, Zhubei (TW); Hua-Yu Liao, New Taipei (TW)

(73) Assignee: SHENZHEN SOUTH SILICON VALLEY MICROELECTRONICS CO., LIMITED, Hsinchu County (TW)

( * ) Notice: Subject to any disclaimer, the term of this patent is extended or adjusted under 35 U.S.C. 154(b) by 0 days.

(21) Appl. No.: 15/201,974

(22) Filed: Jul. 5, 2016

(30) Foreign Application Priority Data

May 19, 2016 (CN) .......................... 2016 1 0338861

(51) Int. Cl.
   *H03F 3/04* (2006.01)
   *H03F 3/45* (2006.01)
   *H03F 1/56* (2006.01)
   *H03F 3/195* (2006.01)

(52) U.S. Cl.
   CPC ........... *H03F 3/45179* (2013.01); *H03F 1/56* (2013.01); *H03F 3/195* (2013.01); *H03F 2200/451* (2013.01); *H03F 2200/507* (2013.01); *H03F 2203/45154* (2013.01)

(58) Field of Classification Search
   CPC .... H03F 1/0211; H03F 1/0244; H03F 1/0277; H03F 3/45
   USPC .................................. 330/51, 127, 297, 261
   See application file for complete search history.

(56) References Cited

U.S. PATENT DOCUMENTS 6,614,309 B1 * 9/2003 Pehlke .................... H03F 1/025
                                                       330/296
2011/0316634 A1 * 12/2011 Vasani .................. H03F 1/0244
                                                       330/296

OTHER PUBLICATIONS

Biranchinath Sahu et al., "A high-efficiency linear RF power amplifier with a power-tracking dynamically adaptive buck-boost supply," in IEEE Transactions on Microwave Theory and Techniques, vol. 52, No. 1, pp. 112-120, Jan. 2004. doi: 10.1109/TMTT.2003.821256.

* cited by examiner

*Primary Examiner* — Steven J Mottola
(74) *Attorney, Agent, or Firm* — WPAT, PC

(57) ABSTRACT

A power amplifying circuit includes a switching circuit, an amplifier and a load. The switching circuit receives a first supply voltage and a second supply voltage. When the switching circuit is in a first operation mode, the first supply voltage is provided to a node. When the switching circuit is in a second operation mode, the second supply voltage is provided to the node. The amplifier receives a first input signal and a second input signal, and outputs a first output signal and a second output signal from a first output terminal and a second output terminal, respectively. The load includes a first inductor and a second inductor. The first inductor is connected between the node and the first output terminal. The second inductor is connected between the node and the second output terminal.

12 Claims, 9 Drawing Sheets

POWER AMPLIFYING CIRCUIT

This application claims the benefit of People's Republic of China Patent Application No. 201610338861.X, filed May 19, 2016, the subject matter of which is incorporated herein by reference.

FIELD OF THE INVENTION

The present invention relates to a power amplifying circuit, and more particularly to a power amplifying circuit capable of selectively outputting high power or low power.

BACKGROUND OF THE INVENTION

FIG. 1 is a schematic functional block diagram of a conventional transmitter. As shown in FIG. 1, the conventional transmitter 10 comprises a digital-to-analog converter (DAC) 12, a low pass filter (LPF) 14, a modulator 16, a programmable gain amplifier (PGA) 18 and a power amplifier 20.

The transmitter 10 is connected with an antenna (not shown) to transmit a signal to the antenna. Consequently, the antenna generates a wireless radio frequency signal to a receiver at a remote side. The programmable gain amplifier 18 and the power amplifier 20 can control the output power in order to adjust the radiation intensity of the wireless radio frequency signal.

SUMMARY OF THE INVENTION

The present invention provides a power amplifying circuit. The power amplifying circuit is selectively operated in a high output power mode or a low output power mode according to the practical requirements.

An embodiment of the present invention provides a power amplifying circuit. The power amplifying circuit includes a switching circuit, an amplifier and a load. The switching circuit receives a first supply voltage and a second supply voltage. The first supply voltage is provided to a node when the switching circuit is in a first operation mode. The second supply voltage is provided to the node when the switching circuit is in a second operation mode. The amplifier receives a first input signal and a second input signal, and outputs a first output signal and a second output signal from a first output terminal and a second output signal, respectively. The load includes a first inductor and a second inductor. The first inductor is connected between the node and the first output terminal. The second inductor is connected between the node and the second output terminal.

Another embodiment of the present invention provides a power amplifying circuit. The power amplifying circuit includes a switching circuit, a first amplifier, a second amplifier and a load. The switching circuit receives a first supply voltage and a second supply voltage. The first supply voltage is provided to a node when the switching circuit is in a first operation mode. The second supply voltage is provided to the node when the switching circuit is in a second operation mode. The first amplifier and the second amplifier receive a first input signal and a second input signal. When one of the first amplifier and the second amplifier is enabled, and a first output signal and a second output signal are outputted from a first output terminal and a second output signal, respectively. The load includes a first inductor and a second inductor. The first inductor is connected between the node and the first output terminal. The second inductor is connected between the node and the second output terminal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
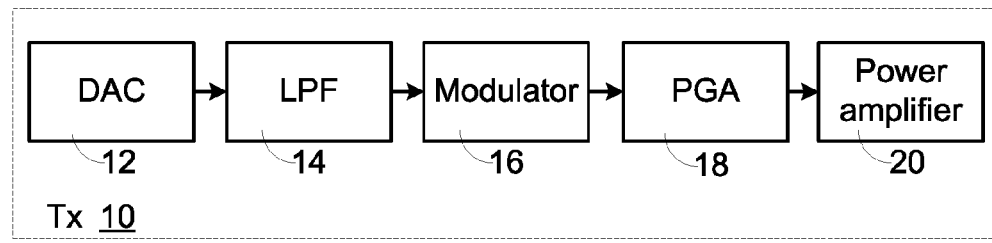
FIG. 1 (prior art) is a schematic functional block diagram of a conventional transmitter.
Figure 2:
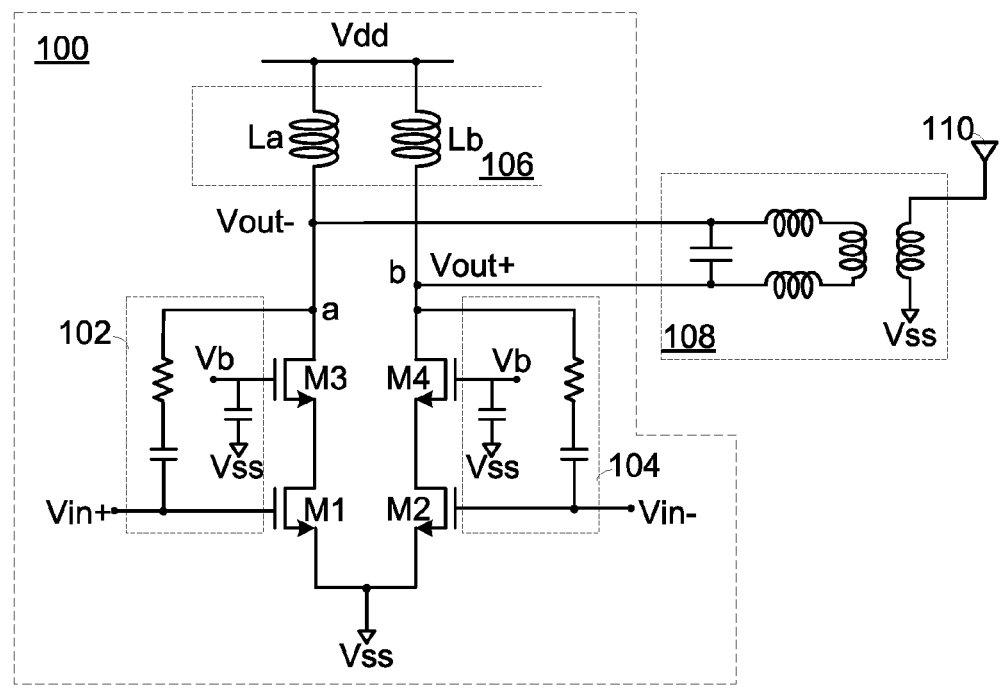
FIG. 2 is a schematic circuit diagram illustrating a power amplifying circuit.

FIG. 2 is a schematic circuit diagram illustrating a power amplifying circuit. As shown in FIG. 2, the power amplifying circuit 100 comprises plural transistors M1~M4, two biasing and matching circuits 102, 104 and a load 106.

The transistors M1 and M2 are collaboratively defined as a differential pair circuit. The source terminal of the transistor M1 is connected with a supply voltage Vss. The gate terminal of the transistor M1 receives a first input signal Vin+. The source terminal of the transistor M2 is connected with the supply voltage Vss. The gate terminal of the transistor M2 receives a second input signal Vin−. The first input signal Vin+ and the second input signal Vin− are collaboratively defined as a differential input signal pair. The supply voltage Vss is a ground voltage.

The source terminal of the transistor M3 is connected with the drain terminal of the transistor M1. The gate terminal of the transistor M3 is connected with the biasing and matching circuit 102. The drain terminal of the transistor M3 is connected with a node a. The source terminal of the transistor M4 is connected with the drain terminal of the transistor M2. The gate terminal of the transistor M4 is connected with the biasing and matching circuit 104. The drain terminal of the transistor M4 is connected with a node b. The node b is a first output terminal of the power amplifying circuit 100. A first output signal Vout+ is outputted from the node b. The node a is a second output terminal of the power amplifying circuit 100. A second output signal Vout− is outputted from the node a. The first output signal Vout+ and the second output signal Vout− are collaboratively defined as a differential output signal pair.

The load 106 comprises an inductor La and an inductor Lb. The inductor La is connected with the node a and a supply voltage Vdd. The inductor Lb is connected with the node b and the supply voltage Vdd.

The two biasing and matching circuits 102 and 104 have the identical circuitry configurations. For example, the biasing and matching circuit 102 comprises a feedback capacitor, a resistor and a bias voltage source. The feedback capacitor and the resistor are connected in series between the node a and the gate terminal of the transistor M1. The bias voltage source is connected with the gate terminal of the transistor M3. Moreover, a capacitor is connected between the gate terminal of the transistor M3 and the supply voltage Vss. It is noted that the circuitry configurations of the biasing and matching circuits 102 and 104 may be designed and modified according to the practical requirements.

Moreover, a matching network 108 receives the differential output signal pair from the power amplifying circuit 100, and generates a wireless radio frequency (RF) signal through an antenna 110. The matching network 108 comprises a capacitor, several inductors and a transformer for performing an impedance matching operation on the output impedance of the power amplifying circuit 100. It is noted that the circuitry configuration of the matching network 108 may be designed and modified according to the practical requirements.

Generally, the components of the power amplifying circuit 100 except for the load 106 are included in an integrated circuit (IC). The load 106, the matching network 108 and the antenna are mounted on a circuit board. For allowing the power amplifying circuit 100 to produce high output power, the highest voltage of the integrated circuit is used as the supply voltage Vdd and supplied to the power amplifying circuit 100.

Moreover, for allowing the power amplifying circuit 100 to produce low output power, it is necessary to adjust the biasing and matching circuits 102 and 104 to reduce the bias current of the power amplifying circuit 100. Under this circumstance, the power efficiency of the power amplifying circuit 100 is reduced. For solving the drawback, it is necessary to provide an improved power amplifying circuit.

Figure 3:
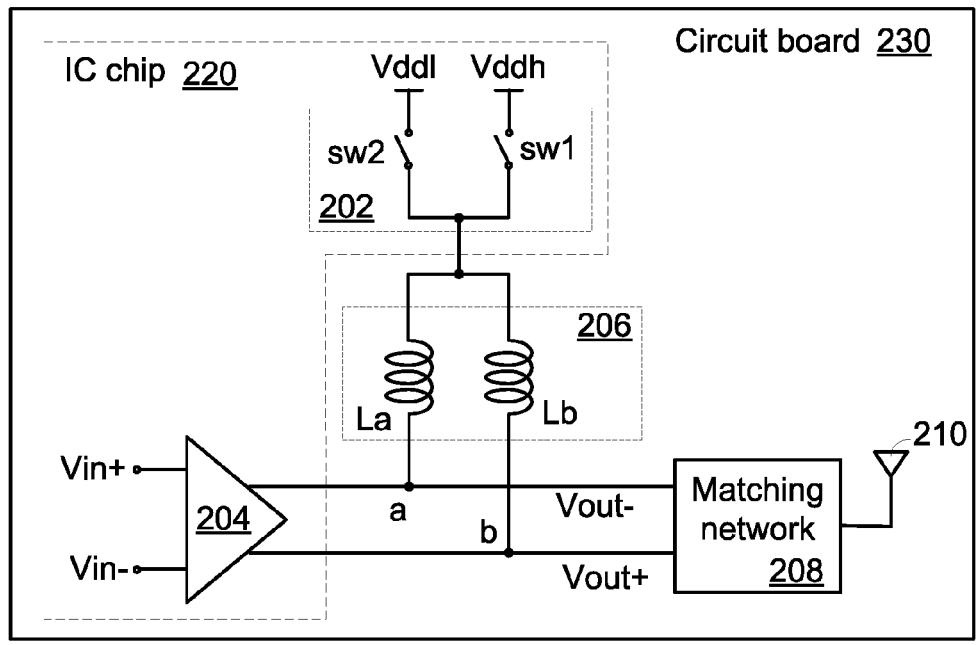
FIG. 3 is a schematic circuit diagram illustrating the concept of a power amplifying circuit according to the present invention.

FIG. 3 is a schematic circuit diagram illustrating the concept of a power amplifying circuit according to the present invention. As shown in FIG. 3, the power amplifying circuit comprises a differential amplifier 204, a switching circuit 202 and a load 206. The differential amplifier 204 and the switching circuit 202 are included in an integrated circuit chip (IC chip) 220. The IC chip 220 and the load 206 are mounted on a circuit board 230. Moreover, a matching network 208 and an antenna 210 are also mounted on the circuit board 230.

Moreover, a front end circuit (not shown) is included in the IC chip 220. The front end circuit comprises a digital-to-analog converter (DAC), a low pass filter (LPF), a modulator and a programmable gain amplifier (PGA). The front end circuit generates a first input signal Vin+ and a second input signal Vin− to the differential amplifier 204. Moreover, a first output signal Vout+ and a second output signal Vout− are outputted from the differential amplifier 204. The first input signal Vin+ and the second input signal Vin− are collaboratively defined as a differential input signal pair. The first output signal Vout+ and the second output signal Vout− are collaboratively defined as a differential output signal pair.

The load 206 comprises an inductor La and an inductor Lb. The inductor La is connected between the node a and the switching circuit 202. The inductor Lb is connected between the node b and the switching circuit 202.

The switching circuit 202 comprises two switch elements sw1 and sw2. When the power amplifying circuit is operated in a high output power mode, the switch element sw1 of the switching circuit 202 is in a close state, and the switch element sw2 of the switching circuit 202 is in an open state. Consequently, a high supply voltage Vddh is supplied to the load 206. When the power amplifying circuit is operated in a low output power mode, the switch element sw2 of the switching circuit 202 is in the close state, and the switch element sw1 of the switching circuit 202 is in the open state. Consequently, a low supply voltage Vddl is supplied to the load 206.

The IC chip 220 further comprises a DC-to-DC converter (not shown). The DC-to-DC converter is used for converting the high supply voltage Vddh into the low supply voltage Vddl, or converting a battery voltage Vbat into the low supply voltage Vddl.

Moreover, the two output terminals of the power amplifying circuit are connected with the matching network 208. The matching network 208 receives the differential output signal pair (Vout+, Vout−) from the power amplifying circuit, and generates the wireless RF signal through the antenna 210. Like the power amplifying circuit of FIG. 2, the matching network 208 of this embodiment comprises a capacitor, several inductors, and a transformer for performing an impedance matching operation on the output impedance of the power amplifying circuit. It is noted that the circuitry configuration of the matching network 208 may be designed and modified according to the practical requirements.

Figure 4:
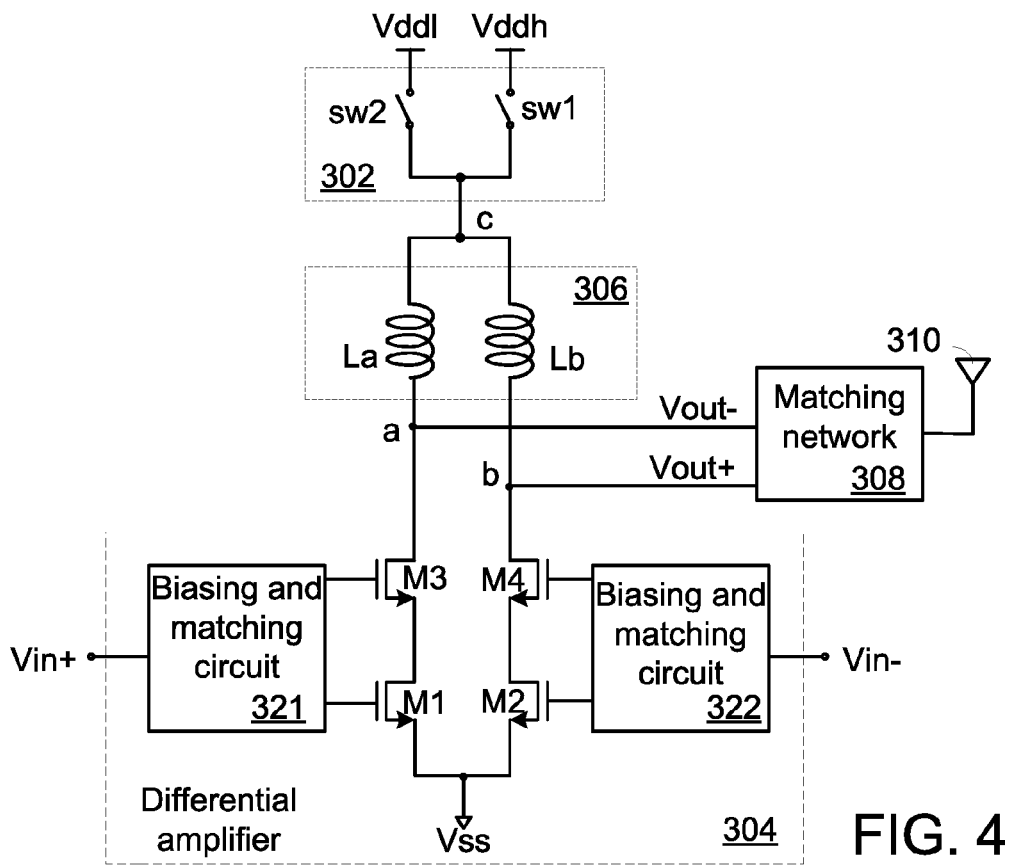
FIG. 4 is a schematic circuit diagram illustrating a power amplifying circuit according to a first embodiment of the present invention.

FIG. 4 is a schematic circuit diagram illustrating a power amplifying circuit according to a first embodiment of the present invention. As shown in FIG. 4, the power amplifying circuit comprises a differential amplifier 304, a switching circuit 302 and a load 306.

The differential amplifier 304 comprises plural transistors M1~M4 and two biasing and matching circuits 321, 322. The source terminal of the transistor M1 is connected with a supply voltage Vss. The source terminal of the transistor M3 is connected with the drain terminal of the transistor M1. The drain terminal of the transistor M3 is connected with the node a. The source terminal of the transistor M2 is connected with the supply voltage Vss. The source terminal of the transistor M4 is connected with the drain terminal of the transistor M2. The drain terminal of the transistor M4 is connected with the node b. The supply voltage Vss is a ground voltage.

The biasing and matching circuit 321 receives the first input signal Vin+. Moreover, the biasing and matching circuit 321 is connected with the gate terminal of the transistor M1 and the gate terminal of the transistor M3. The biasing and matching circuit 322 receives the second input signal Vin−. Moreover, the biasing and matching circuit 322 is connected with the gate terminal of the transistor M2 and the gate terminal of the transistor M4. The circuitry configurations of the biasing and matching circuits 321 and 322 are similar to those of the biasing and matching circuits 102 and 104. It is noted that the circuitry configurations of the biasing and matching circuits 321 and 322 may be designed and modified according to the practical requirements.

The switching circuit 302 comprises two switch elements sw1 and sw2. The switch element sw1 is connected between a high supply voltage Vddh and a node c. The switch element sw2 is connected between a low supply voltage Vddl and the node c. The switch elements sw1 and sw2 are power switches. Moreover, the high supply voltage Vddh is higher than the low supply voltage Vddl, and the low supply voltage Vddl is higher than the supply voltage Vss. For example, the high supply voltage Vddh, the low supply voltage Vddl and the supply voltage Vss are 3.3V, 1.8V and 0V, respectively.

The load 306 comprises an inductor La and an inductor Lb. The inductor La is connected between the node a and the node c. The inductor Lb is connected between the node b and the node c.

When the power amplifying circuit is operated in a high output power mode, the switch element sw1 of the switching circuit 302 is in a close state, and the switch element sw2 of the switching circuit 302 is in an open state. Consequently, the high supply voltage Vddh is supplied to the load 306. When the power amplifying circuit is operated in a low output power mode, the switch element sw2 of the switching circuit 302 is in the close state, and the switch element sw1 of the switching circuit 302 is in the open state. Consequently, the low supply voltage Vddl is supplied to the load 306.

The node a and the node b are two output terminals of the power amplifying circuit. The two output terminals of the power amplifying circuit are connected with a matching network 308. The matching network 308 receives the differential output signal pair (Vout+, Vout−) from the power amplifying circuit, and generates a wireless RF signal through an antenna 310.

Figure 5:
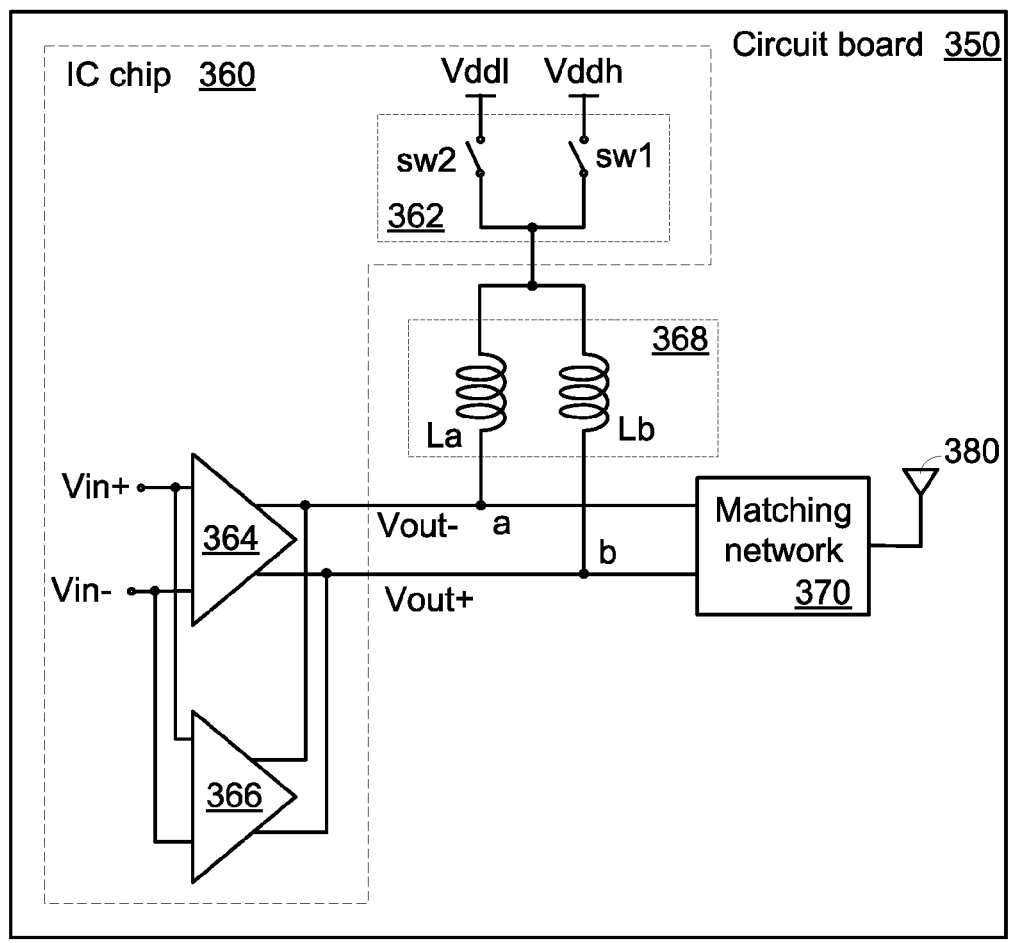
FIG. 5 is a schematic circuit diagram illustrating the concept of another power amplifying circuit according to the present invention.

FIG. 5 is a schematic circuit diagram illustrating the concept of another power amplifying circuit according to the present invention. As shown in FIG. 5, the power amplifying circuit comprises a first differential amplifier 364, a second differential amplifier 366, a switching circuit 362 and a load 368. The first differential amplifier 364, the second differential amplifier 366 and the switching circuit 362 are included in an integrated circuit chip (IC chip) 360. The IC chip 360 and the load 368 are mounted on a circuit board 350. Moreover, a matching network 370 and an antenna 380 are also mounted on the circuit board 350.

Moreover, a front end circuit (not shown) is included in the IC chip 360. The front end circuit comprises a digital-to-analog converter (DAC), a low pass filter (LPF), a modulator and a programmable gain amplifier (PGA). The front end circuit generates a first input signal Vin+ and a second input signal Vin− to the first differential amplifier 364 and the second differential amplifier 366.

Moreover, when one of the first differential amplifier 364 and the second differential amplifier 366 is enabled, a first output signal Vout+ and a second output signal Vout− are outputted. The first input signal Vin+ and the second input signal Vin− are collaboratively defined as a differential input signal pair. The first output signal Vout+ and the second output signal Vout− are collaboratively defined as a differential output signal pair. The load 368 comprises an inductor La and an inductor Lb. The inductor La is connected between the node a and the switching circuit 362. The inductor Lb is connected between the node b and the switching circuit 362.

The switching circuit 362 comprises two switch elements sw1 and sw2. By controlling the first differential amplifier 364, the second differential amplifier 366 and the switch elements sw1 and sw2 of the switching circuit 362, the power amplifying circuit is operated in a proper output power mode.

The IC chip 360 further comprises a DC-to-DC converter (not shown). The DC-to-DC converter is used for converting the high supply voltage Vddh into the low supply voltage Vddl, or converting a battery voltage Vbat into the low supply voltage Vddl.

Moreover, the two output terminals of the power amplifying circuit are connected with the matching network 370. The matching network 370 receives the differential output signal pair (Vout+, Vout−) from the power amplifying circuit, and generates the wireless RF signal through the antenna 380. Like the power amplifying circuit of FIG. 2, the matching network 380 of this embodiment comprises a capacitor and several inductors for performing an impedance matching operation on the output impedance of the power amplifying circuit. It is noted that the circuitry configuration of the matching network 380 may be designed and modified according to the practical requirements.

Figure 6:
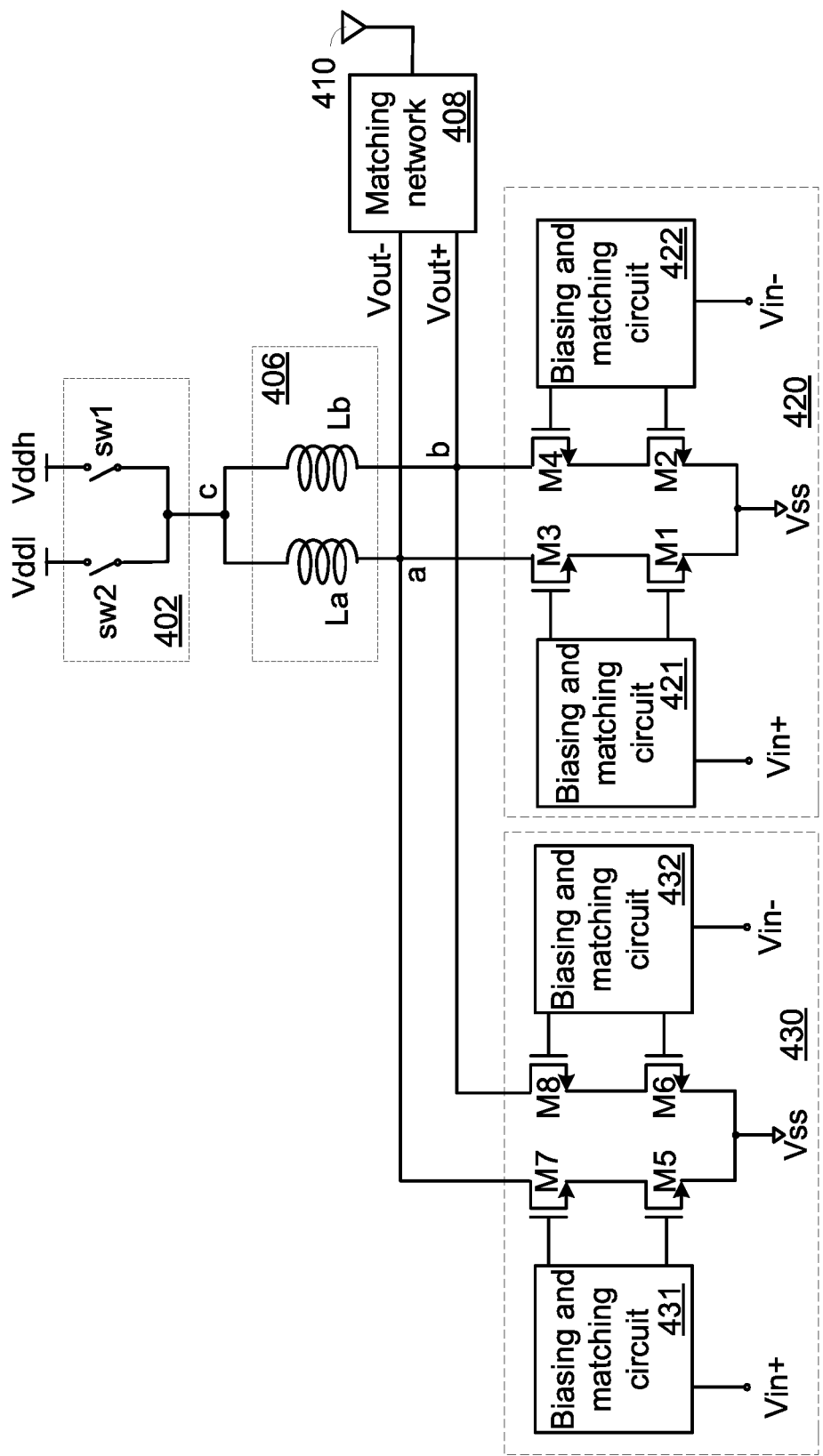
FIG. 6 is a schematic circuit diagram illustrating a power amplifying circuit according to a second embodiment of the present invention.

FIG. 6 is a schematic circuit diagram illustrating a power amplifying circuit according to a second embodiment of the present invention. As shown in FIG. 6, the power amplifying circuit comprises a first differential amplifier 420, a second differential amplifier 430, a switching circuit 402 and a load 406.

The first differential amplifier 420 comprises plural transistors M1~M4 and two biasing and matching circuits 421, 422. The source terminal of the transistor M1 is connected with a supply voltage Vss. The source terminal of the transistor M3 is connected with the drain terminal of the transistor M1. The drain terminal of the transistor M3 is connected with the node a. The source terminal of the transistor M2 is connected with the supply voltage Vss. The source terminal of the transistor M4 is connected with the drain terminal of the transistor M2. The drain terminal of the transistor M4 is connected with the node b. The supply voltage Vss is a ground voltage. The biasing and matching circuit 421 receives the first input signal Vin+. Moreover, the biasing and matching circuit 421 is connected with the gate terminal of the transistor M1 and the gate terminal of the transistor M3. The biasing and matching circuit 422 receives the second input signal Vin−. Moreover, the biasing and matching circuit 422 is connected with the gate terminal of the transistor M2 and the gate terminal of the transistor M4.

The second differential amplifier 430 comprises plural transistors M5~M8 and two biasing and matching circuits 431, 432. The source terminal of the transistor M5 is connected with the supply voltage Vss. The source terminal of the transistor M7 is connected with the drain terminal of the transistor M5. The drain terminal of the transistor M7 is connected with the node a. The source terminal of the transistor M6 is connected with the supply voltage Vss. The source terminal of the transistor M8 is connected with the drain terminal of the transistor M6. The drain terminal of the transistor M8 is connected with the node b. The biasing and matching circuit 431 receives the first input signal Vin+. Moreover, the biasing and matching circuit 431 is connected with the gate terminal of the transistor M5 and the gate terminal of the transistor M7. The biasing and matching circuit 432 receives the second input signal Vin−. Moreover, the biasing and matching circuit 432 is connected with the gate terminal of the transistor M6 and the gate terminal of the transistor M8.

Moreover, the first differential amplifier 420 is operated in a high output power mode, and the second differential amplifier 430 is operated in a low output power mode. That is, the power amplifying circuit is operated in the high output power mode when the first differential amplifier 420 is enabled and the second differential amplifier 430 is disabled, and the power amplifying circuit is operated in the low output power mode when the second differential amplifier 430 is enabled and the first differential amplifier 420 is disabled.

Moreover, the biasing and matching circuits 421 and 422 of the first differential amplifier 420 are operated in the high output power mode, and the biasing and matching circuits 431 and 432 of the second differential amplifier 430 are operated in the low output power mode. In other words, the impedance values of the biasing and matching circuits 421 and 422 are different from the impedance values of the biasing and matching circuits 431 and 432.

The switching circuit 402 comprises two switch elements sw1 and sw2. The switch element sw1 is connected between a high supply voltage Vddh and a node c. The switch element sw2 is connected between a low supply voltage Vddl and the node c. The switch elements sw1 and sw2 are power switches. Moreover, the high supply voltage Vddh is higher than the low supply voltage Vddl, and the low supply voltage Vddl is higher than the supply voltage Vss. For example, the high supply voltage Vddh, the low supply voltage Vddl and the supply voltage Vss are 3.3V, 1.8V and 0V, respectively.

The load 406 comprises an inductor La and an inductor Lb. The inductor La is connected between the node a and the node c. The inductor Lb is connected between the node b and the node c.

When the power amplifying circuit is operated in a high output power mode, the switch element sw1 of the switching circuit 402 is in a close state, and the switch element sw2 of the switching circuit 402 is in an open state. Consequently, the high supply voltage Vddh is supplied to the load 406. When the power amplifying circuit is operated in a low output power mode, the switch element sw2 of the switching circuit 402 is in the close state, and the switch element sw1 of the switching circuit 402 is in the open state. Consequently, the low supply voltage Vddl is supplied to the load 406.

The node a and the node b are two output terminals of the power amplifying circuit. The two output terminals of the power amplifying circuit are connected with a matching network 408. The matching network 408 receives the differential output signal pair (Vout+, Vout−) from the power amplifying circuit, and generates a wireless RF signal through an antenna 410.

Figure 7:
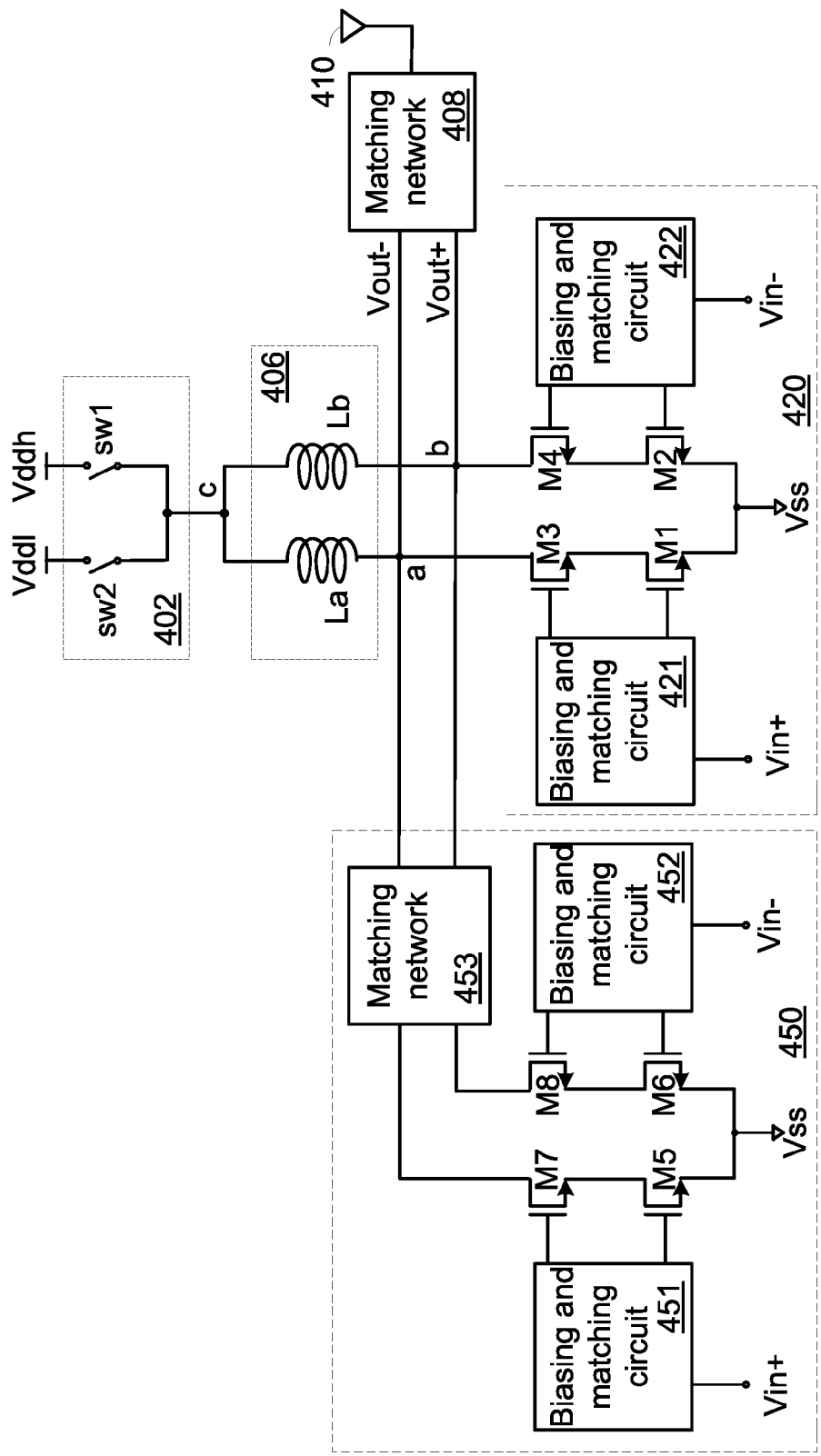
FIG. 7 is a schematic circuit diagram illustrating a power amplifying circuit according to a third embodiment of the present invention.

FIG. 7 is a schematic circuit diagram illustrating a power amplifying circuit according to a third embodiment of the present invention. As shown in FIG. 7, the power amplifying circuit comprises a first differential amplifier 420, a second differential amplifier 450, a switching circuit 402 and a load 406. The second differential amplifier 450 of this embodiment is distinguished from the second differential amplifier of the second embodiment. The other components of this embodiment are similar to those of the second embodiment, and are not redundantly described herein.

The second differential amplifier 450 comprises plural transistors M5~M8, two biasing and matching circuits 451, 452, and a matching network 453. The source terminal of the transistor M5 is connected with the supply voltage Vss. The source terminal of the transistor M7 is connected with the drain terminal of the transistor M5. The drain terminal of the transistor M7 is connected with the matching network 453. The source terminal of the transistor M6 is connected with the supply voltage Vss. The source terminal of the transistor M8 is connected with the drain terminal of the transistor M6. The drain terminal of the transistor M8 is connected with the matching network 453. The matching network 453 is used for performing an impedance matching operation on the output impedance of the second differential amplifier 450.

From the above descriptions, the power amplifying circuit is operated in the high output power mode or the low output power mode. In the high output power mode, the switching circuit provides the high supply voltage (e.g., 3.3V). In the low output power mode, the switching circuit provides the low supply voltage (e.g., 1.8V).

As known, the Wi-Fi technology and the Bluetooth (BT) technology comply with the wireless communication standard. In case that the transmitter is operated according to the Wi-Fi technology, the transmitter can selectively output high power or low power to transmit the wireless Wi-Fi signal. However, since the Bluetooth (BT) technology is a low-power wireless transmission technology, the transmitter uses low output power to transmit the wireless BT signal. Consequently, in case that the high-power Wi-Fi technology or the low-power Bluetooth is employed, the power amplifying circuit of the present invention can be included in the transmitter. Moreover, in case that the Wi-Fi technology is employed, low power is outputted for the short-distance transmission and high power is outputted for the long-distance transmission.

FIGS. 8A-8G are schematic circuit diagrams illustrating the power amplifying circuit in different operation modes. Please also refer to the power amplifying circuit of FIG. 5. In this embodiment, the first differential amplifier 364 is operated in the high output power mode, and the second differential amplifier 366 is operated in the low output power mode.

Figure 8A:
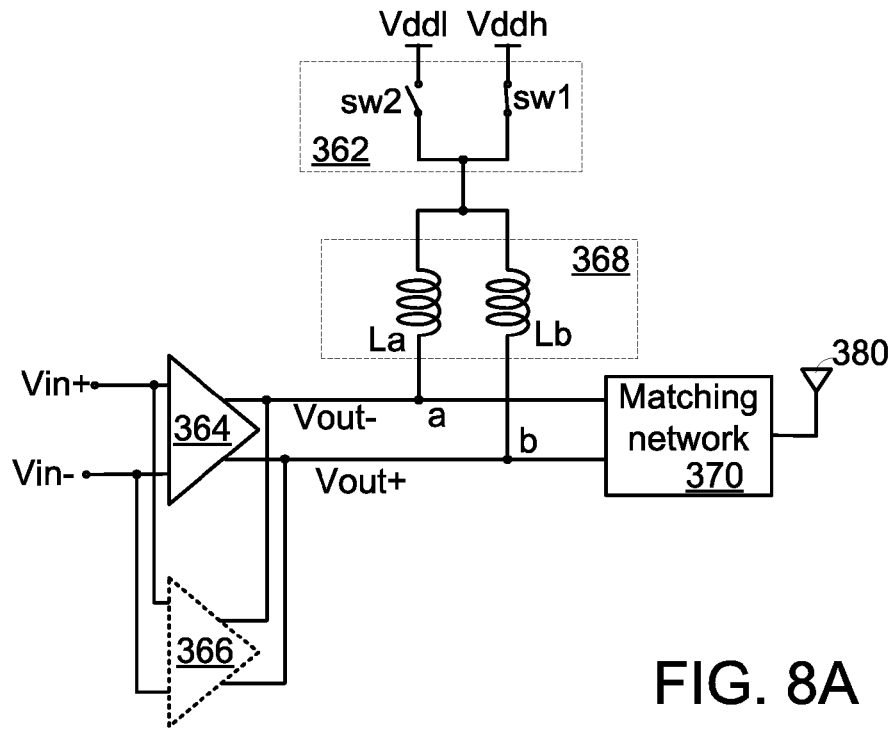
FIGS. 8A-8G are schematic circuit diagrams illustrating the power amplifying circuit in different operation modes.

Please refer to FIG. 8A. The power amplifying circuit is operated in a high output power mode according to the Wi-Fi technology. Meanwhile, the first differential amplifier 364 is enabled, the second differential amplifier 366 is disabled, the switch element sw1 is in the close state, and the switch element sw2 is in the open state. Consequently, the transmitter outputs high power to transmit the wireless Wi-Fi signal, and the wireless Wi-Fi signal is suitable for long-distance transmission.

Figure 8B:
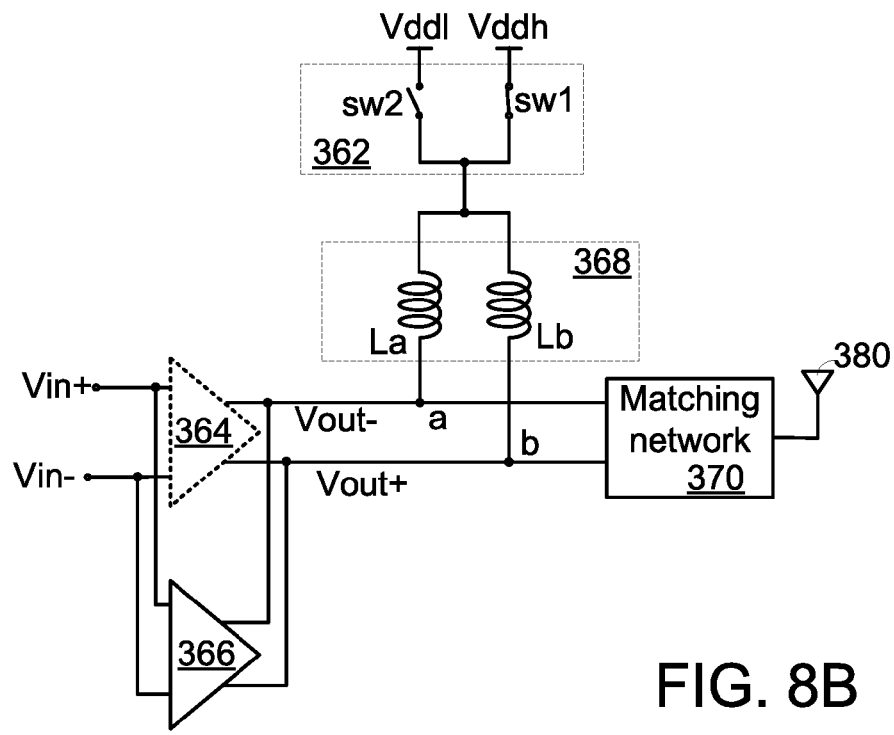

Please refer to FIG. 8B. The power amplifying circuit is operated in a first low output power mode according to the Wi-Fi technology. Meanwhile, the first differential amplifier 364 is disabled, the second differential amplifier 366 is enabled, the switch element sw1 is in the close state, and the switch element sw2 is in the open state. Consequently, the transmitter outputs low power to transmit the wireless Wi-Fi signal, and the wireless Wi-Fi signal is suitable for short-distance transmission.

Figure 8C:
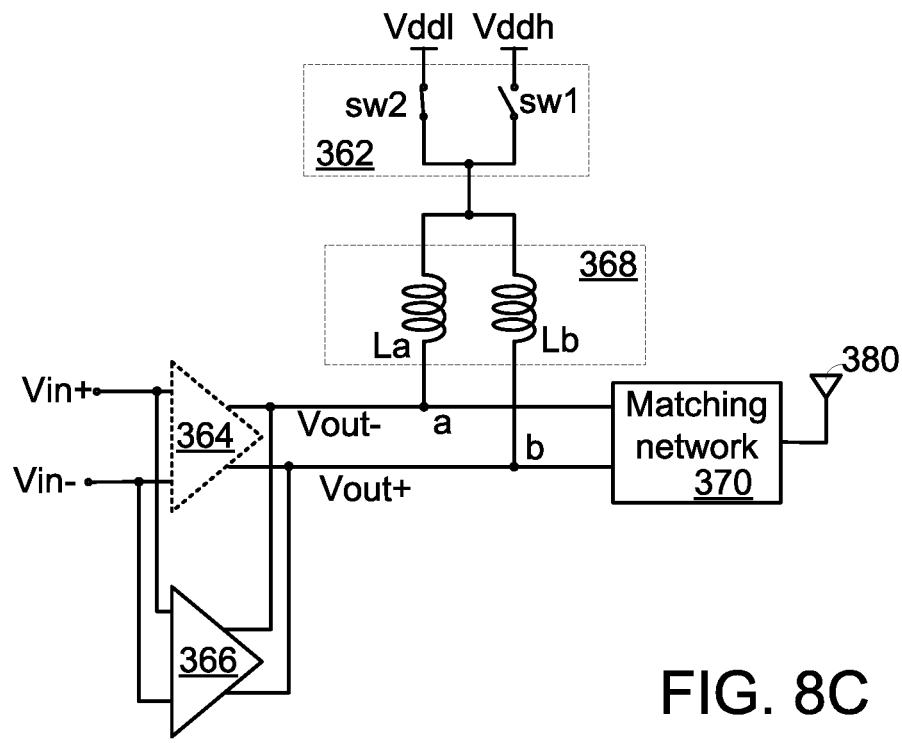

Please refer to FIG. 8C. The power amplifying circuit is operated in a second low output power mode according to the Wi-Fi technology. Meanwhile, the first differential amplifier 364 is disabled, the second differential amplifier 366 is enabled, the switch element sw1 is in the open state, and the switch element sw2 is in the close state. Consequently, the transmitter outputs low power to transmit the wireless Wi-Fi signal, and the wireless Wi-Fi signal is suitable for short-distance transmission.

Figure 8D:
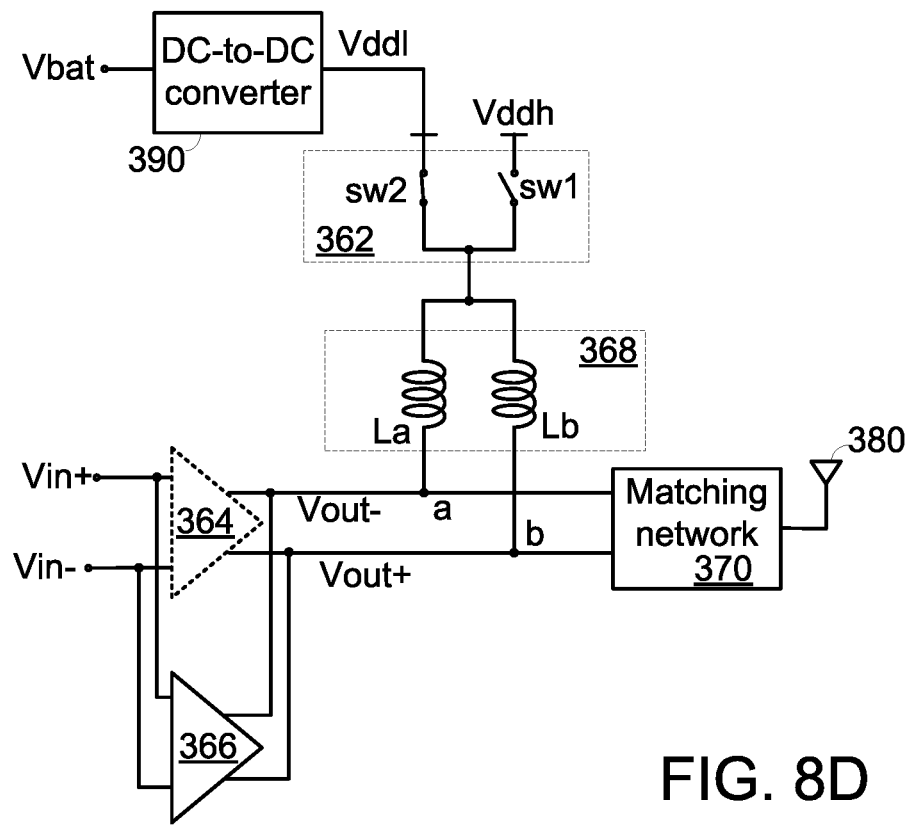

Please refer to FIG. 8D. The power amplifying circuit is operated in a third low output power mode according to the Wi-Fi technology. Meanwhile, the first differential amplifier 364 is disabled, the second differential amplifier 366 is enabled, the switch element sw1 is in the open state, and the switch element sw2 is in the close state. Moreover, by a DC-to-DC converter 390, a battery voltage Vbat is converted into the low supply voltage Vddl. Consequently, the transmitter outputs low power to transmit the wireless Wi-Fi signal, and the wireless Wi-Fi signal is suitable for short-distance transmission.

Figure 8E:
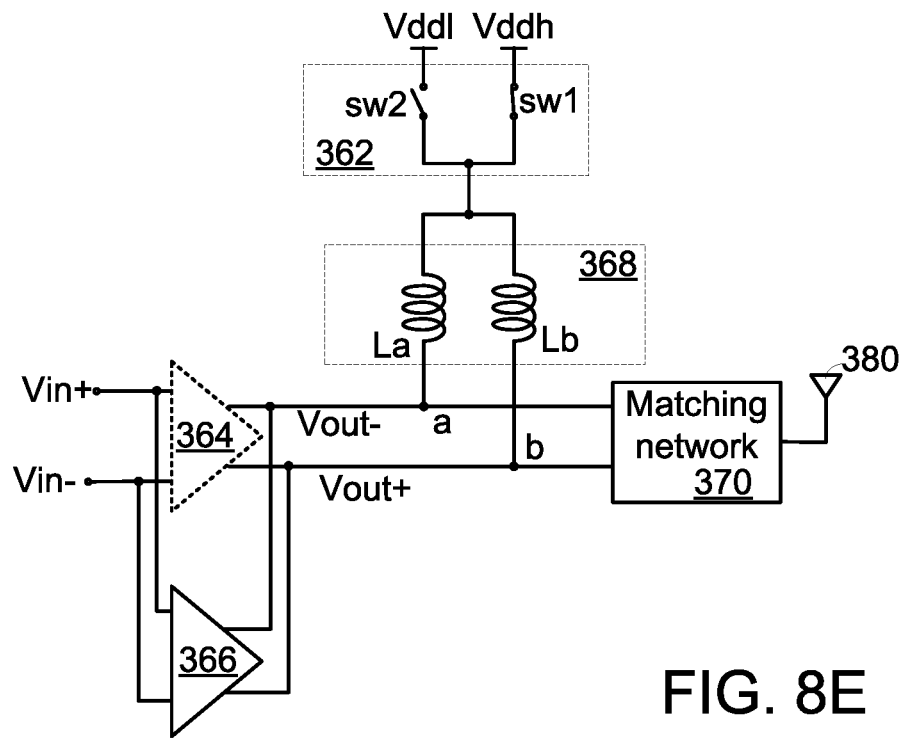

Please refer to FIG. 8E. The power amplifying circuit is operated in a first low output power mode according to the Bluetooth technology. Meanwhile, the first differential amplifier 364 is disabled, the second differential amplifier 366 is enabled, the switch element sw1 is in the close state, and the switch element sw2 is in the open state. Consequently, the transmitter outputs low power to transmit the wireless BT signal.

Figure 8F:
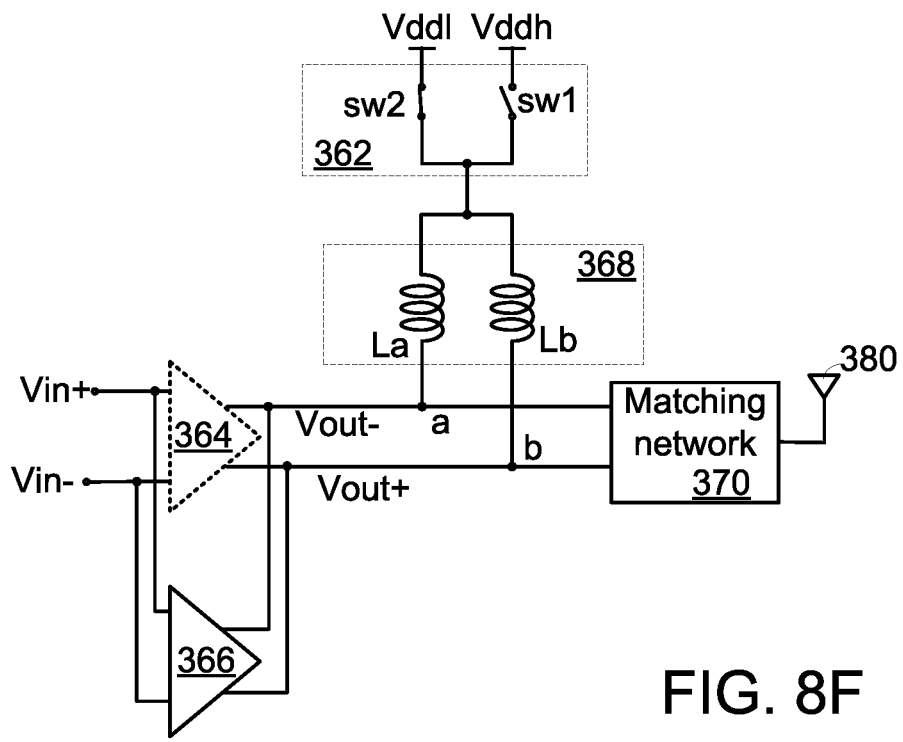

Please refer to FIG. 8F. The power amplifying circuit is operated in a second low output power mode according to the Bluetooth technology. Meanwhile, the first differential amplifier 364 is disabled, the second differential amplifier 366 is enabled, the switch element sw1 is in the open state, and the switch element sw2 is in the close state. Consequently, the transmitter outputs low power to transmit the wireless BT signal.

Figure 8G:
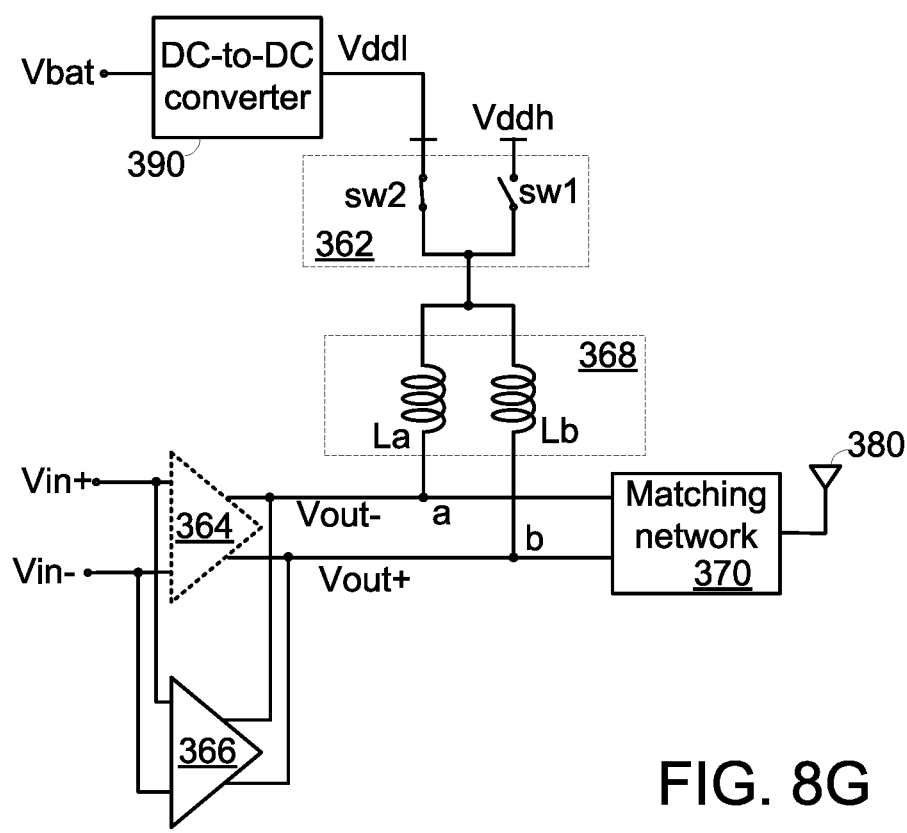

Please refer to FIG. 8G. The power amplifying circuit is operated in a third low output power mode according to the Bluetooth technology. Meanwhile, the first differential amplifier 364 is disabled, the second differential amplifier 366 is enabled, the switch element sw1 is in the open state, and the switch element sw2 is in the close state. Moreover, by a DC-to-DC converter 390, a battery voltage Vbat is converted into the low supply voltage Vddl. Consequently, the transmitter outputs low power to transmit the wireless BT signal.

In the above embodiments, the differential amplifier is included in the power amplifying circuit. It is noted that the example of the power amplifying circuit is not restricted. In some other embodiments, a single-ended amplifier is included in the power amplifying circuit of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power amplifying circuit, comprising:
   a switching circuit receiving a first supply voltage and a second supply voltage, wherein the first supply voltage is provided to a node when the switching circuit is in a first operation mode, and the second supply voltage is provided to the node when the switching circuit is in a second operation mode;
   an amplifier receiving a first input signal and a second input signal, and outputting a first output signal and a second output signal from a first output terminal and a second output terminal, respectively;
   a first matching network connected with the first output terminal and the second output terminal;
   an antenna connected with the first matching network for generating a wireless radio frequency signal; and
   a load comprising a first inductor and a second inductor, wherein the first inductor is connected between the node and the first output terminal, and the second inductor is connected between the node and the second output terminal;
   wherein the amplifier and the switching circuit are included in an IC chip, and the IC chip, the load, the first matching network and the antenna are mounted on a circuit board.

2. The power amplifying circuit as claimed in claim 1, wherein the switching circuit comprises a first switch element and a second switch element, wherein the first switch element is connected between the first supply voltage and the node, and the second switch element is connected between the second supply voltage and the node.

3. The power amplifying circuit as claimed in claim 2, wherein the first switch element and the second switch element are power switches.

4. The power amplifying circuit as claimed in claim 2, wherein the first operation mode is a high output power mode, the second operation mode is a low output power mode, and the first supply voltage is higher than the second supply voltage, wherein when the switching circuit is in the high output power mode, the first switching element is in a close state and the second switching element is in an open state, wherein when the switching circuit is in the low output power mode, the second switching element is in the close state and the first switching element is in the open state.

5. The power amplifying circuit as claimed in claim 1, wherein the amplifier is a differential amplifier, and the differential amplifier comprises:
   a first transistor, wherein a source terminal of the first transistor is connected with a third supply voltage;
   a second transistor, wherein a source terminal of the second transistor is connected with the third supply voltage;
   a third transistor, wherein a source terminal of the third transistor is connected with a drain terminal of the first transistor, and a drain terminal of the third transistor is connected with the first output terminal;
   a fourth transistor, wherein a source terminal of the fourth transistor is connected with a drain terminal of the second transistor, and a drain terminal of the fourth transistor is connected with the second output terminal;
   a first biasing and matching circuit receiving the first input signal, and connected with a gate terminal of the first transistor and a gate terminal of the third transistor; and
   a second biasing and matching circuit receiving the second input signal, and connected with a gate terminal of the second transistor and a gate terminal of the fourth transistor.

6. A power amplifying circuit, comprising:
   a switching circuit receiving a first supply voltage and a second supply voltage, wherein the first supply voltage is provided to a node when the switching circuit is in a first operation mode, and the second supply voltage is provided to the node when the switching circuit is in a second operation mode;
   a first amplifier and a second amplifier receiving a first input signal and a second input signal, wherein when one of the first amplifier and the second amplifier is enabled, and a first output signal and a second output signal are outputted from a first output terminal and a second output terminal, respectively;
   a first matching network connected with the first output terminal and the second output terminal;
   an antenna connected with the first matching network for generating a wireless radio frequency signal; and
   a load comprising a first inductor and a second inductor, wherein the first inductor is connected between the node and the first output terminal, and the second inductor is connected between the node and the second output terminal;

wherein the first amplifier, the second amplifier and the switching circuit are included in an IC chip, and the IC chip, the load, the first matching network and the antenna are mounted on a circuit board.

7. The power amplifying circuit as claimed in claim 6, wherein the switching circuit comprises a first switch element and a second switch element, wherein the first switch element is connected between the first supply voltage and the node, and the second switch element is connected between the second supply voltage and the node.

8. The power amplifying circuit as claimed in claim 7, wherein the first switch element and the second switch element are power switches.

9. The power amplifying circuit as claimed in claim 7, wherein
the first operation mode is a high output power mode, the second operation mode is a low output power mode, and the first supply voltage is higher than the second supply voltage.

10. The power amplifying circuit as claimed in claim 6, wherein the first amplifier comprises:
a first transistor, wherein a source terminal of the first transistor is connected with a third supply voltage;
a second transistor, wherein a source terminal of the second transistor is connected with the third supply voltage;
a third transistor, wherein a source terminal of the third transistor is connected with a drain terminal of the first transistor, and a drain terminal of the third transistor is connected with the first output terminal;
a fourth transistor, wherein a source terminal of the fourth transistor is connected with a drain terminal of the second transistor, and a drain terminal of the fourth transistor is connected with the second output terminal;
a first biasing and matching circuit receiving the first input signal, and connected with a gate terminal of the first transistor and a gate terminal of the third transistor; and
a second biasing and matching circuit receiving the second input signal, and connected with a gate terminal of the second transistor and a gate terminal of the fourth transistor.

11. The power amplifying circuit as claimed in claim 10, wherein the second amplifier comprises:

a fifth transistor, wherein a source terminal of the fifth transistor is connected with the third supply voltage;
a sixth transistor, wherein a source terminal of the sixth transistor is connected with the third supply voltage;
a seventh transistor, wherein a source terminal of the seventh transistor is connected with a drain terminal of the fifth transistor, and a drain terminal of the seventh transistor is connected with the first output terminal;
an eighth transistor, wherein a source terminal of the eighth transistor is connected with a drain terminal of the sixth transistor, and a drain terminal of the eighth transistor is connected with the second output terminal;
a third biasing and matching circuit receiving the first input signal, and connected with a gate terminal of the fifth transistor and a gate terminal of the seventh transistor; and
a fourth biasing and matching circuit receiving the second input signal, and connected with a gate terminal of the sixth transistor and a gate terminal of the eighth transistor.

12. The power amplifying circuit as claimed in claim 10, wherein the second amplifier comprises:
a fifth transistor, wherein a source terminal of the fifth transistor is connected with the third supply voltage;
a sixth transistor, wherein a source terminal of the sixth transistor is connected with the third supply voltage;
a seventh transistor, wherein a source terminal of the seventh transistor is connected with a drain terminal of the fifth transistor, and a drain terminal of the seventh transistor is connected with the first output terminal;
an eighth transistor, wherein a source terminal of the eighth transistor is connected with a drain terminal of the sixth transistor, and a drain terminal of the eighth transistor is connected with the second output terminal;
a third biasing and matching circuit receiving the first input signal, and connected with a gate terminal of the fifth transistor and a gate terminal of the seventh transistor;
a fourth biasing and matching circuit receiving the second input signal, and connected with a gate terminal of the sixth transistor and a gate terminal of the eighth transistor; and
a second matching network connected with the first output terminal, the second output terminal, the drain terminal of the seventh transistor and the drain terminal of the eighth transistor.

* * * * *